United States Patent
Wallow et al.

(10) Patent No.: US 7,390,377 B1
(45) Date of Patent: Jun. 24, 2008

(54) BONDING THERMOPLASTIC POLYMERS

(75) Inventors: Thomas I. Wallow, Fremont, CA (US);
Marion C. Hunter, Livermore, CA (US); Karen Lee Krafcik, Livermore, CA (US); Alfredo M. Morales, Livermore, CA (US); Blake A. Simmons, San Francisco, CA (US); Linda A. Domeier, Danville, CA (US)

(73) Assignee: Sandia Corporation, Livermore, CA (US)

( * ) Notice: Subject to any disclaimer, the term of this patent is extended or adjusted under 35 U.S.C. 154(b) by 283 days.

(21) Appl. No.: 11/234,607

(22) Filed: Sep. 22, 2005

(51) Int. Cl.
*C09J 5/02* (2006.01)
*B31F 1/12* (2006.01)
(52) U.S. Cl. ................................... 156/308.6; 156/183
(58) Field of Classification Search .............. 156/183, 156/308.6
See application file for complete search history.

(56) References Cited

U.S. PATENT DOCUMENTS

| | | | | |
|---|---|---|---|---|
| 3,527,665 | A | 9/1970 | Wright et al. | 161/92 |
| 3,962,498 | A | 6/1976 | Owston | 427/322 |
| 4,824,500 | A * | 4/1989 | White et al. | 156/94 |
| 5,891,367 | A | 4/1999 | Basheer et al. | 252/514 |
| 6,176,962 | B1 | 1/2001 | Soane et al. | 156/292 |
| 6,184,284 | B1 | 2/2001 | Stokich, Jr. et al. | 524/500 |
| 6,590,033 | B2 * | 7/2003 | Ding et al. | 525/191 |
| 6,811,725 | B2 | 11/2004 | Nguyen et al. | 252/511 |
| 6,850,355 | B2 * | 2/2005 | Liang et al. | 359/296 |
| 7,238,246 | B2 * | 7/2007 | Peters et al. | 156/83 |
| 2001/0054778 | A1 * | 12/2001 | Unger et al. | 264/239 |
| 2004/0084402 | A1 * | 5/2004 | Ashmead et al. | 216/27 |
| 2005/0100712 | A1 | 5/2005 | Simmons et al. | 428/172 |
| 2005/0109396 | A1 * | 5/2005 | Zucchelli et al. | 137/67 |
| 2005/0130292 | A1 | 6/2005 | Ahn et al. | 435/287.1 |
| 2005/0151371 | A1 | 7/2005 | Simmons et al. | 285/125.1 |
| 2005/0249637 | A1 * | 11/2005 | Kawazoe et al. | 422/99 |

FOREIGN PATENT DOCUMENTS

WO WO03070623 2/2003

OTHER PUBLICATIONS

Thomas, N.; and Windle, A.H.; "Transport off methanol in poly(methyl methacrylate)," *Polymer*, 1978 v.19(March), pp. 255-265.
Thomas, N.L.; and Windle, A.H.; "Diffusion mechanisms of the system PMMA—methanol," *Polymer*, 1981 v.22(May), pp. 627-639.

(Continued)

*Primary Examiner*—Philip C Tucker
*Assistant Examiner*—Michael N Orlando
(74) *Attorney, Agent, or Firm*—Timothy P. Evans

(57) ABSTRACT

We demonstrate a new method for joining patterned thermoplastic parts into layered structures. The method takes advantage of case-II permeant diffusion to generate dimensionally controlled, activated bonding layers at the surfaces being joined. It is capable of producing bonds characterized by cohesive failure while preserving the fidelity of patterned features in the bonding surfaces. This approach is uniquely suited to production of microfluidic multilayer structures, as it allows the bond-forming interface between plastic parts to be precisely manipulated at micrometer length scales. The bond enhancing procedure is easily integrated in standard process flows and requires no specialized equipment.

10 Claims, 8 Drawing Sheets

OTHER PUBLICATIONS

Thomas, N.L.; and Windle, A.H.; "A theory of Case II diffusion," *Polymer*, 1982 v.23(April), pp. 529-542.

Sarti, G.C.; Gostoli, C.; and Masoni, S.; "Diffusion of Alcohols and Relaxation In Poly(methyl methacrylate): Effect of Thermal History," *Journal of Membrane Science*, 1983 v.25, pp. 181-192.

Windle, A.H. in *Polymer Permeability*, ed. Comyn, J.; Elsevier Applied Science, London, 1985; Chapter 3, pp. 75-118.

Hui, C.-Y.; and Wu, K.-C.; "Case-II diffusion in polymers, I. Transient swelling," *Journal of Applied Physics*, 1987 v.61(11), pp. 5129-5136.

Hui, C.-Y.; and Wu, K.-C.; "Case-II diffusion in polymers. II. Steady-state Front motion," *Journal of Applied Physics*, 1987 v.61(11), pp. 5137-5149.

Lasky, R.C.; Kramer, E.J.; and Hui, C.-Y.; "The initial stage of Case II diffusion at low penetrant activities," *Polymer*, 1988 v.29(April), pp. 673-679.

Lasky, R.C.; Kramer, E.J.; and Hui, C.-Y.; "Temperature dependence of case II diffusion," *Polymer*, 1988 v.29(June), pp. 1131-1136.

Hui, C.-Y.; and Wu, K.-C.; Lasky, R.C.; and Kramer, E.J.; "Chemically Driven Deformation," *Journal of Electronic Packaging*, 1989 v.111, pp. 68-73.

Gall, T.P.; Lasky, R.C.; and Kramer, E.J.; "Case II diffusion: effect of solvent molecule size," *Polymer*, 1990 v.31(August), pp. 1491-1499.

Drake, P.A.; and Bohn, P.W.; "Interfacial Events Associated with Case II Diffusion in the Poly(methylmethacrylate/$CH_3OH$ System," *Applied Spectroscopy*, 1996 v.50(8), pp. 1023-1029.

Edwards, D.A; "Non-Fickian Diffusion in Thin Polymer Films," *Journal of Polymer Science B*, 1996 v.34, pp. 981-997.

Argon, A.S.; Cohen, R.E.; and Patel, A.C.; "A mechanistic model of case II diffusion of a diluent into a glassy polymer," *Polymer*, 1999 v.40, pp. 6991-7012.

El Afif, A.; and Grmela, M.; "Non-Fickian mass transport in polymers," *Journal of Rheology*, 2002, v.46(3), pp. 591-627.

Shin, J.Y.; "Chemical structure and physical properties of cyclic olefin copolymers," *IUPAC Pure and Applied Chemistry*, 2005 v.77, pp. 801-814.

* cited by examiner time << thickness/$v_o$ time ~ thickness/$v_o$

BONDING THERMOPLASTIC POLYMERS

STATEMENT OF GOVERNMENT SUPPORT

The United States Government has a paid-up license in this invention and the right in limited circumstances to require the patent owner to license others on reasonable terms as provided for by the terms of contract No. DE-AC04-94AL85000 awarded by the U.S. Department of Energy to Sandia Corporation.

BACKGROUND OF THE INVENTION

1. Field of the Invention

This invention relates generally to the preparation of microfluidic chips and particularly those chips fabricated from thermoplastic materials.

Thermoplastic polymers generally comprise the set of linear polymers that are not cross-linked and are therefore free to flow as a liquid above a certain temperature. This class of polymers includes polyethylenes, polypropylenes, vinylidene chloride copolymers, polystyrenes, polycarbonates, polymethylmethacrylates ("PMMA"), polyvinylchloride, polyoxymethylenes, polysulfones, polyetheretherketones, polyamides, polyphenylenes, cyclic olefin copolymers, and many others. Of these, Cyclic Olefin Copolymers (hereinafter "COCs") comprise a subset of thermoplastic polymer materials characterized by a usefully high glass-transition temperature (hereinafter "$T_g$"), high transparency, low birefringence, high rigidity, strength and hardness, low water absorbency, and good resistance to acids and alkalis making these materials particularly well suited for use in fabricating diagnostic equipment and devices that rely on visible and ultraviolet (hereinafter "UV") light for interrogation techniques.

Several types of cyclic olefin copolymers are available commercially based on different types of cyclic monomers and polymerization methods. A review of their structure and physical properties is presented in a technical report by Shin, et al., published in IUPAC journal of Pure and Applied Chemistry, v. 77 (5), pp. 801-814, 2005 and is herein incorporated by reference. In particular, COCs such as ZEONOR®, (a product of the Nippon Zeon Co., Ltd. Corporation Japan, Tokyo, Japan, available from its American subsidiary Zeon Chemicals L.P., Louisville, Ky.) show utility as substrates for microfluidic devices. The thermal properties of this class of plastics may be tailored to fit desired application specifications and are compatible with standard molding and stamping techniques. Furthermore, the optical properties of these materials (i.e., negligible bulk fluorescence and amorphous structure with low intrinsic light scattering) allow the detection of very weak sample fluorescence signals in microfluidic devices fabricated from these plastics. Finally, the material bulk properties of these materials result in robust, resilient microfluidic devices capable of surviving extended field-use, and although their surface properties are not ideal, they nevertheless accommodate a variety of water-based analytical methods.

This application addresses the challenges that arise in assembling COC parts into multilayer structures where it is necessary to produce microfluidic devices comprised of two or more COC pieces (hereinafter 'multilayer structures'). In order to do so, pieces must be joined, preferably in a manner that forms a bond line whose mechanical strength is comparable to that of the bulk material. Moreover, during the joining process, any distortions of features formed in the surfaces of the device to be joined must be minimized in order to avoid compromising the device function.

COC multilayer structures are currently produced using thermal bonding procedures, wherein the parts to be joined are aligned and superimposed, and then heated under pressure until a bond forms. Unfortunately, under conditions necessary for forming an acceptably strong bond, COC polymers undergo significant plastic deformation resulting in distortion or full collapse of micro-features previously formed in one or both bonded surfaces.

Bond formation and plastic deformation are both macroscopic manifestations of the same underlying molecular chain motion; a process which promotes the former will inevitably cause the latter to some degree. In particular, the characteristic time constants for ZEONOR® 1060 plastic deformation at bond-promoting temperatures (i.e., between about 88° C. and 100° C.) are significantly shorter than minimal bonding times dictated by thermal conductivity and process constraints, suggesting that significant feature distortion is inevitable during thermal bonding. Similar situations are likely to hold for analogous COC materials.

2. Related Art

Published U.S. Patent Application Serial Number 2004/0084402 discloses a polymer-based microfluidic device and a method for producing same. This device is suitable for chromatographic and electrophoretic separations in which the detection of the components in the fluid is by means of ultraviolet (UV) spectroscopy. The device further comprises a planar substrate (body) and cover that are bonded together wherein at least first and second intersecting channels disposed at the interface of the bonded surfaces. The application teaches a method, wherein a first injection-molded plaque of COC (with or without microfluidic structures) is placed on top of a second plaque having microfluidic structures. The two pieces are subjected to an axial load of 500 psi to 1000 psi at 75° C. for several minutes. The two pieces are then allowed to cool to about at least 60° C. before the pressure is released. This results in a fluid-tight bond between the two plaques. The application also teaches to pre-treat at least one of the plaque surfaces with polyvinyl alcohol layer before pressure is applied.

Published U.S. Patent Application Serial Number 2005/0130292 is directed to an apparatus and method for placing two microfluidic components in fluid communication at an arbitrary position and time, both of which are externally defined. The device comprises a sandwich of at least three layers: a top side, a bottom side, and an intermediate material layer separating the top and bottom sides and permanently joined to each therebetween. As described by the application, joining is achieved by lamination, hot bonding, UV bonding, and plasma treatment of the surfaces, solvent bonding, pressure adhesive, and heat adhesives. The bonding procedure may exploit polymer foils treated with thermoset films on both sides. The inventive apparatus uses electromagnetic radiation to perforate a material layer having selected adsorptive properties. The perforation of the material layer allows the fluid communication between microfluidic components.

Published U.S. Patent Application Serial Number 2005/0151371 is directed to an Injection molding process used to form microfluidic devices with integrated functional components. One or more functional components are placed in a mold cavity which is then closed. Molten thermoplastic resin is injected into the mold and then cooled, thereby forming a solid substrate including the functional component(s). The solid substrate including the functional component(s) is then bonded to a second substrate which may include microchannels or other features As described by the application, joining is achieved by hot die bonding, thermal diffusion bonding, solvent bonding, infrared welding, ultraviolet irradiation, ultrasonic welding, or other joining technologies known in the art, or combinations thereof.

Other examples exist but none exhibit the essential characteristics of the instant invention.

SUMMARY

The following description addresses procedures which have been discovered that permit assembling COC parts into structures comprising two or more COC pieces (i.e., 'multi-layer structures') wherein the interface at which the pieces are joined (i.e., the bond line) exhibits a mechanical strength comparable to that of the bulk material. Moreover, during the joining process, distortions of features formed into the surfaces of the device (e.g., microchannels, reservoirs, ports) to be joined are minimized in order to avoid compromising the device function.

Disclosed is a method for providing a polymeric microfluidic device which comprises a planar body (substrate) having a first surface and a planar cover having a first surface, wherein the first surface of the cover is bonded to the first surface of the body, and wherein each of the body and cover are fabricated from a polymeric material. The disclosed method provides a device comprising one or more microchannels, disposed therein at the interface of the bonded surfaces, having interior feature dimensions in the range of from about 0.1 micrometer to about 10 cm, which remain undistorted after bonding.

The method teaches a case-II diffusion bonding process for joining a cyclic olefin copolymer (COC).

The method also enables a microfluidic device to be used when ultraviolet spectrophotometry is used for detecting analytes moving through the channels.

Therefore, it is an object of this invention to provide a method for joining surfaces of stamped or embossed polymer sheets having microchannel features disposed therein without collapsing, blocking or otherwise distorting those features.

It is another object of this invention to provide a method for joining parts fabricated from COC and other thermoplastic materials.

Still another object of the invention is to provide a device having little or no UV absorption at wavelengths greater than about 300 nm.

Another object of the invention is to provide a method for bonding thermoplastic materials that produces uniform surface properties on all channel surfaces of devices contained in the material.

It is yet another object of this invention to provide a composition for pre-treating the surfaces of the COC article in order to facilitate diffusion bonding.

To achieve these and other objects, there is provided a method for producing sealed polymeric microfluidic devices. Moreover, these and other objects, advantages, and features of the invention will become apparent to those skilled in the art after reading the following description of the various embodiments when considered with the appended claims.

BRIEF DESCRIPTION OF THE DRAWINGS

FIG. 1A shows the plastic microfluidic parts to be joined.

FIG. 1B shows immersion of parts in a medium that promotes case-II permeation into the plastic.

FIG. 1C shows joining of the surface-permeated parts in a press.

FIG. 1D shows the final joined part.

DETAILED DESCRIPTION OF THE PREFERRED EMBODIMENTS

While the applicant does not wish to be tied to any particular theory as to the operability of the invention, it is believed the process for forming a polymer bond between thermoplastic parts, and particularly between COC parts, recited in the following embodiments are controlled by the procedural steps described below. A diagrammatic illustration of the process used in the present embodiments is shown in FIGS. 1A through 1D.

Figure 1A:
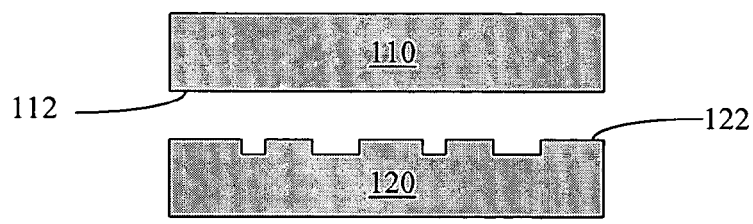
FIGS. 1A to 1D show a diagrammatic illustration of the case-II enhanced bonding process.
Figure 1B:
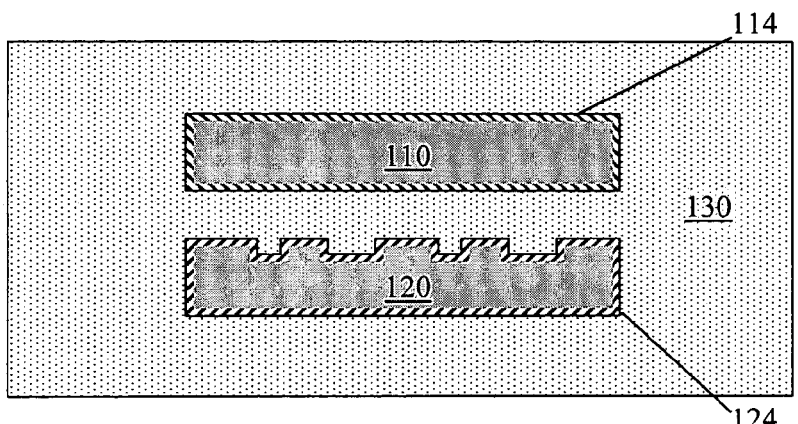
Figure 1C:
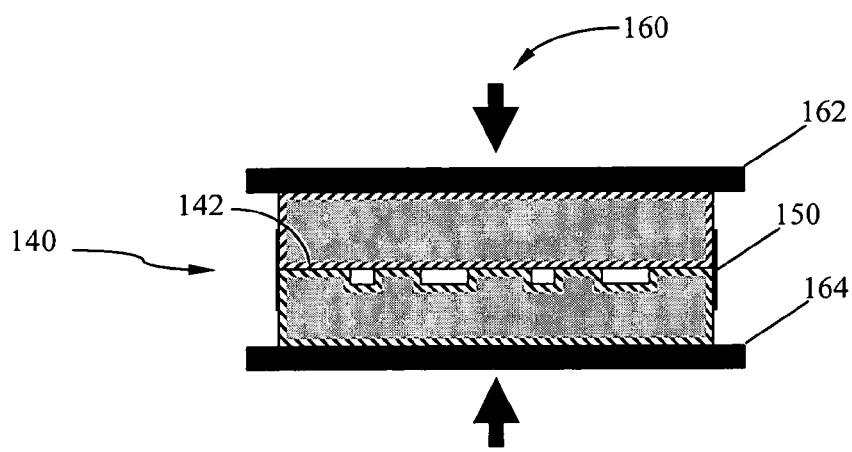
Figure 1D:
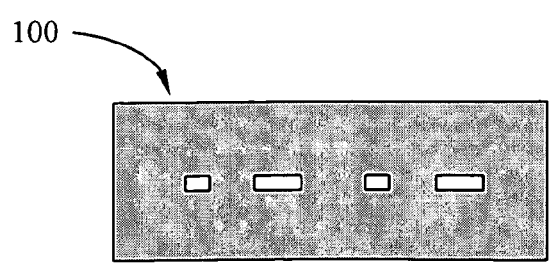
Figure 2A:
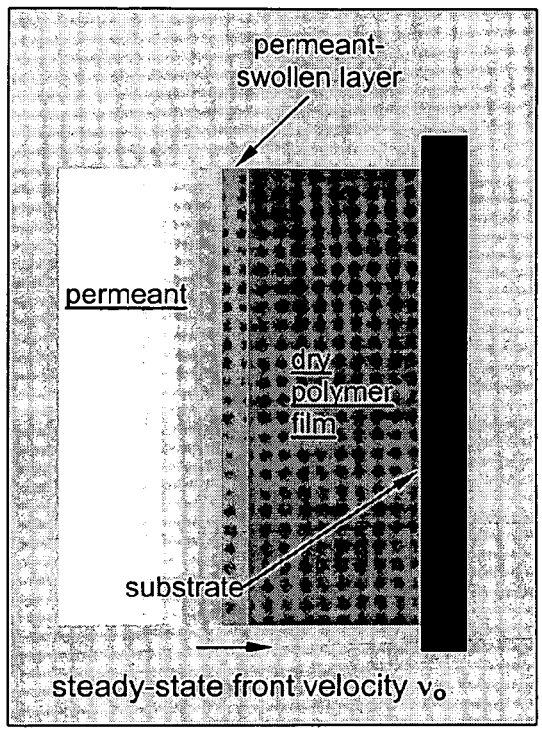
FIG. 2A shows a schematic illustration of case-II permeation into a thin polymer film where a linear transformation of the dry polymer film into a "permeant" swollen film occurs and where a discontinuous permeant concentration profile is observed at a time much less than a time quantity equal to the film thickness divided by the permeant front velocity $v_0$.
Figure 2B:
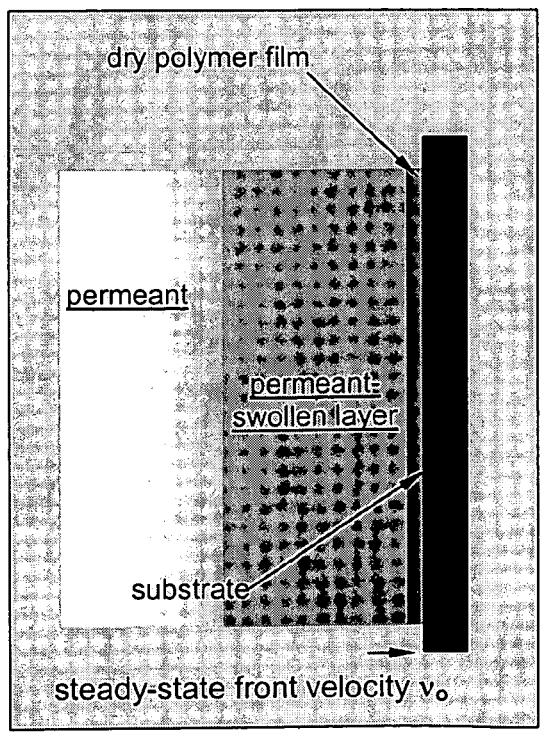
FIG. 2B shows a schematic illustration of case-II permeation into a thin polymer film where a linear transformation of the dry polymer film into a permeant-swollen film occurs and a discontinuous permeant concentration profile is observed at a time about equal to a time quantity equal to the film thickness divided by the permeant front velocity $v_0$.
Figures 3A, 3B, 3C, 3D:
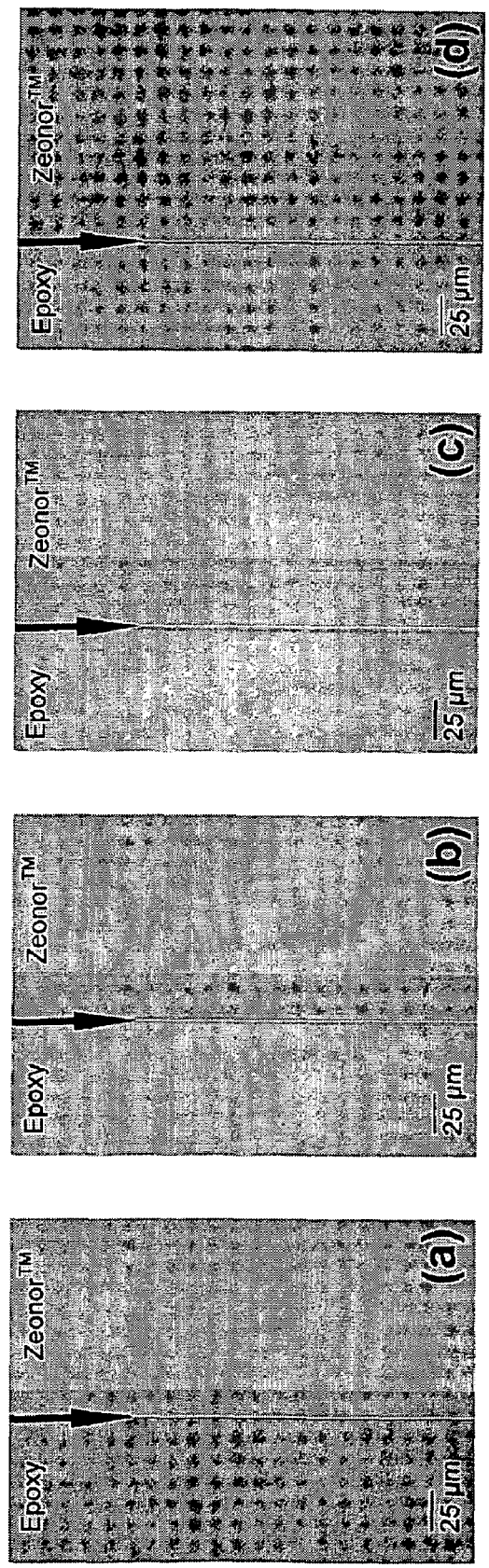
FIGS. 3A to 3D show optical photomicrographs of the propagation of the case-II front, visualized by iodine staining, moving into the bulk ZEONOR® at times equal to 60, 180, 300, and 480 minutes respectively.

Many glassy polymers can interact with various chemical compounds such that the latter are absorbed and diffuse into the bulk of the polymer material by a so-called case-II transport process. Such compounds are referred to be permeant compounds (or simply "permeants,") with respect to the bulk polymer. In this diffusion regime, initial permeation into the polymeric bulk material is followed by drastic acceleration of diffusion into those areas in which the initial permeation has occurred. As a consequence, a diffusion front develops in the polymeric material manifested by 'dry' polymer ahead of the front and a permeant-swollen layer that forms behind the front as is illustrated in FIG. 2A. Once the front is fully formed, it advances into the polymer at a constant rate, $v_o$, through the thickness of the polymer film as illustrated in FIG. 2B.

The case-II permeation studies leading up to this invention were carried out using a quartz-crystal microbalance (hereinafter "QCM"), which allows for precise measurement of film mass as a function of process conditions, and later by bulk staining wherein the progress (advance) of the permeant-rich front can be seen visually as shown in FIGS. 3A-3D.

In a typical experiment, a quartz-crystal wafer with a nominal fundamental resonant frequency of 5 MHz (available from Maxtek Inc., Cypress, Calif., and others) is spin-coated with a ZEONOR® 1060 film. Following coating, the wafers are baked at 180° C. for 10 minutes to yield an annealed, solvent-free film with highly reproducible QCM behavior. Films in the range of 0.2 μm to 0.35 μm are obtained from 5 wt % solutions of ZEONOR® in decahydronaphthalene or 1,8-epoxy-p-menthane (also know as 1,8-cineole) when coated at 1000-2000 rpm. Film thicknesses are independently determined using profilometry or interferometry. Typically, an identically-processed witness wafer is used for these measurements.

The film-coated wafers are mounted on an immersion crystal holder and then connected to a software-controlled driver circuit capable of monitoring the crystal resonant frequency with single-Hz accuracy and precision. Such devices are available from a variety of manufacturers, again such as Maxtek, Inc., Cypress, Calif. Following thermal equilibration, the films are exposed to the desired reagent(s), either by insertion into a vapor-saturated container, or by direct immersion into a solution. Resonant frequency changes are monitored and recorded at appropriate intervals (up to 20 Hz using available equipment.)

In this experimental regime, QCM resonant frequency can be related to polymer film mass using the well-known Sauerbrey correlation. The films generated by the permeant uptake were found to behave well within the limits of the Sauerbrey analysis. Moreover, although several non-ideal physical processes (e.g., gel-like visco-elasticity, excessive mass loading, surface roughening, interfacial slippage, etc.) are known to contribute to deviation from Sauerbrey-like behavior; none are observed or relevant to the studies detailed here.

Therefore, case-II diffusion is readily distinguishable from Fickian diffusion in that the kinetics of mass uptake for case-II diffusion proceeds linearly with time whereas mass uptake for Fickian diffusion proceeds as the square-root of time, i.e., $(time)^{1/2}$. In most ZEONOR® infusion methods examined to date, case-II behavior predominates. Examples of various experimental systems are presented as illustrative of the disclosed invention.

Figure 4:
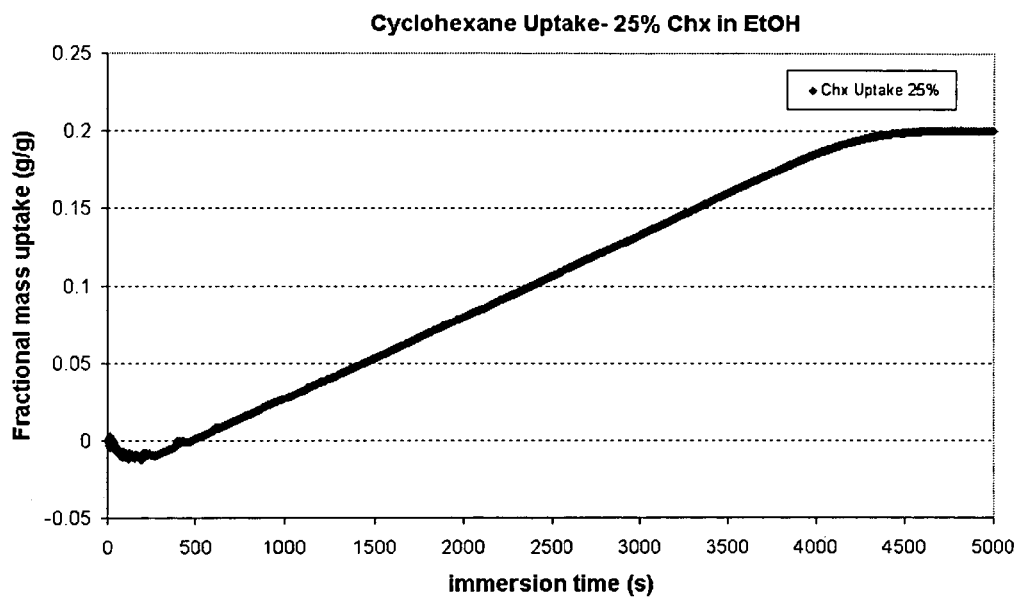
FIG. 4 shows the rate of swelling of ZEONOR® 1060 in a solution of 75:25 ethanbl/cyclohexane, wherein the characteristic induction and linear mass gain is followed by a plateau as the case-II front reaches the quartz substrate.

FIG. 4 shows a typical ZEONOR® thin-film swelling experiment. In this example, the cast and annealed film was immersed in a 75:25 (wt %) mixture of ethanol and cyclohexane at 20° C. An initial induction period (typically observed in case-II diffusion; this is correlated to the initial development of the permeant-swollen layer) is followed by linear mass gain with time until the front reaches the quartz crystal surface. In this example, a case-II front velocity of $6 \times 10^{-3}$ μm/min and equilibrium permeant uptake of 0.2 g permeant/g dry ZEONOR® can be determined using independent measurement of the initial ZEONOR® film thickness.

Figure 5:
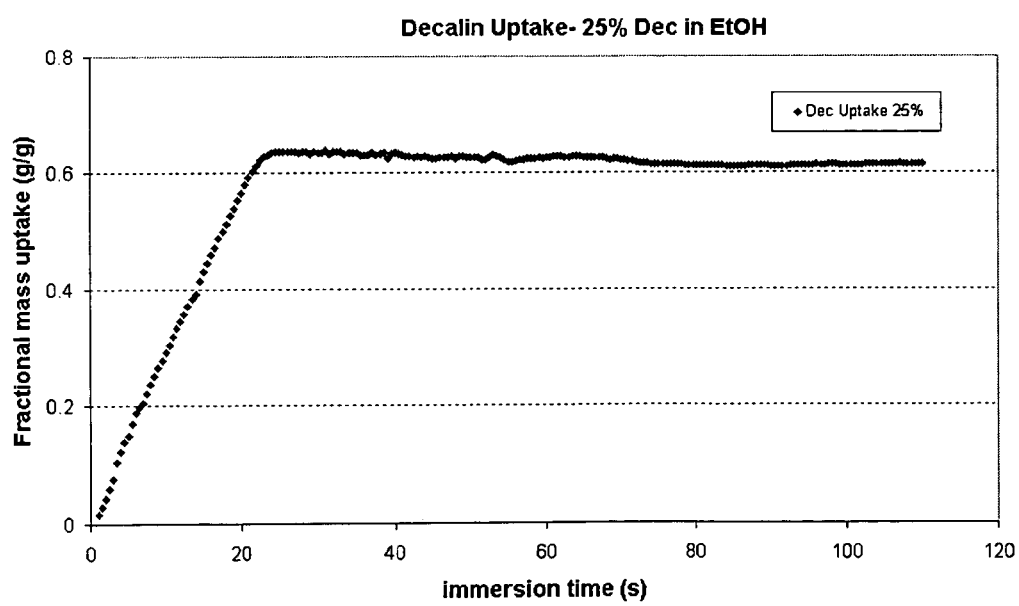
FIG. 5 shows the rate of swelling of ZEONOR® 1060 in a 75:25 solution of ethanol and decahydronaphthalene (cis-trans mixture), wherein the characteristic linear mass gain is followed by a plateau as the case-II front reaches the quartz substrate.

A much faster case-II uptake is shown in FIG. 5. In this example, a cast and annealed film was immersed in a 75:25 (wt %) mixture of ethanol and decahydronaphthalene at 20° C. A case-II front velocity of 1 μm/min and equilibrium permeant uptake of 0.61 g permeant/g dry ZEONOR® can be determined using independent measurement of the initial film thickness. (An induction period may be present, but is obscured by instrumental settling following wafer immersion.)

Figure 6:
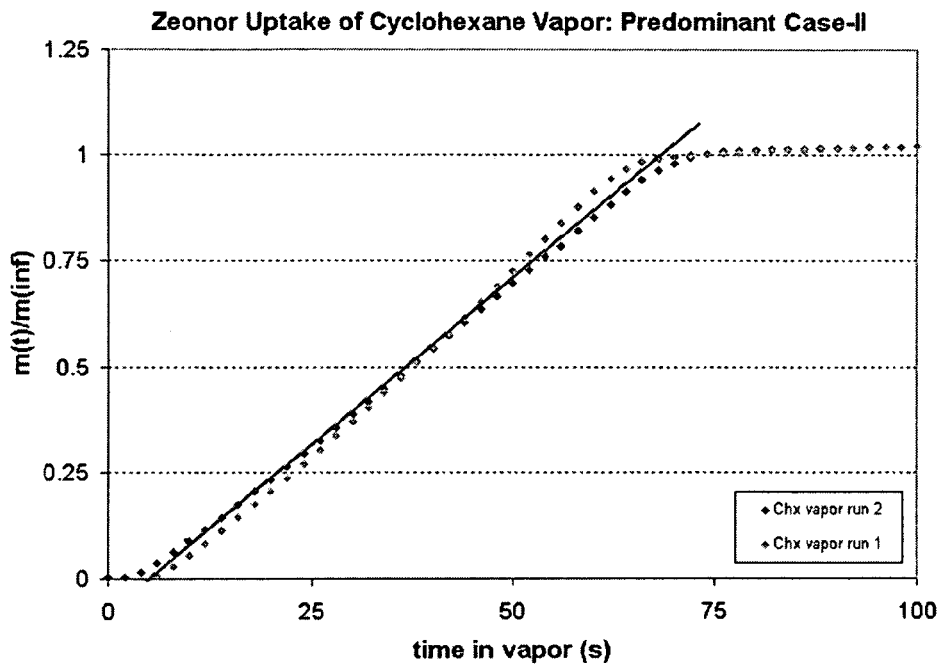
FIG. 6 depicts the rate of vapor permeation of ZEONOR® films by cyclohexane at 20° C. and illustrates that cyclohexane permeation is predominantly case-II mediated.

Vapor infusion experiments are shown in FIG. 6. In these examples, case-II diffusion predominates, but is complicated by additional uptake of permeant following propagation of the front to the quartz crystal surface. This occurs because no non-solvent is present to arrest additional swelling following propagation of the case-II front to the quartz interface. Nevertheless, useful data for case-II front velocities and pseudo-saturation solvent uptake can be inferred.

This case-II permeation effect can be used for creating a controlled, activated bonding zone. In this permeant-swollen surface, layer, polymer chain mobility is much higher than in the bulk copolymer, which allows for faster bond formation at lower temperatures. Joining surfaces in this manner eliminates process constraints imposed by thermal bonding and, when properly implemented, produces strong, distortion-free COC multilayer structures that have been found to fail cohesively. Moreover, it is distinguished from prior art methods of chemically activating a polymer surface in that the current method does not result in the dissolution of the polymer surface. This approach, therefore, is uniquely suited to production of microfluidic multilayer structures, since it allows the bond-forming interface between plastic parts to be precisely manipulated at micron and submicron length scales much smaller than the features present at the bond-forming interface. To the best of our knowledge, it has not been previously reported or implemented.

For a given permeant composition, therefore, it is possible to control the depth to which the swollen layer advances merely by controlling the exposure time of the polymer to the permeant. Exposure of the plastic to the permeant may occur by vapor infusion, pure solvent immersion/infusion, or mixed solvent immersion/infusion. However, it is important to note that while the phenomenology of case-II permeation into glassy polymers such as poly(styrene) and poly(methyl methacrylate) the selection of a useful set of permeants and conditions for implementing a case-II mediated bonding in COCs is not trivial requires significant experimental effort.

We have discovered that a miscible mixture useful for bonding COCs comprises at least a first hydrocarbon compound comprising hydrogen and 6 to 16 carbon atoms and is having a Hildebrand solubility parameter (described in detail in *J. Am. Chem. Soc.*, v.51, pp. 66-80, 1929, and herein incorporated by reference) of between about 14 $MPa^{1/2}$ to about 18 $MPaV^2$ and at least a second hydrocarbon compound comprising hydrogen, 1 to 8 carbon atoms and one or more heteroatoms, such as oxygen and/or nitrogen, and having a Hildebrand solubility parameter of between about 18 $MPa^{1/2}$ to about 29 $MPa^{1/2}$. We have also found that ternary compositions comprising the foregoing binary compositions plus a third hydrocarbon compound comprising hydrogen and 14 to 30 carbon atoms and having a Hildebrand solubility parameter of between about 13 $MPa^{1/2}$ to about 18 $MPa^{1/2}$ are effective in bonding COCs.

In each combination of the foregoing materials the first hydrocarbon compound comprises the bond-promoting permeant species which enters the bulk matrix of the thermoplastic polymer. Examples of the first and third hydrocarbon compound that have been tested for bonding COCs are listed below in TABLE 1. The second compound is a diluent and acts as a layer-former in preventing the dissolution of the layer of the thermoplastic penetrated by the permeant species and retaining the original polymer surface. Examples of second hydrocarbon compounds that have been tested for bonding COCs, or are believed to behave as those that were tested based on their solubility parameters include the alcohols, ethers, ketones, esters, carbonates, nitrites, and amides listed below in TABLE 2.

TABLE 1

| 1st Hydrocarbon Component (Permeant) | Hildebrand Solubility ($\delta_H$) $MPa^{1/2}$ |
|---|---|
| n-Hexane | 14.9 |
| Iso-octane | 14.0 |
| n-Decane | ~15 |
| Dodecane | ~17 |
| Tetramethylpentadecane | ~15.5 |
| n-Hexadecane | 16.4 |
| Eicosane | 13.1 |
| Cyclohexane | 16.8 |
| Decahydronaphthalene | 17.8 |
| Limonene | ~15 |
| Isopropyl benzene | ~17 |

TABLE 2

| 2nd Hydrocarbon Component | Hildebrand Solubility, $\delta_H$ $(MPa^{1/2})$ |
|---|---|
| Methanol | 29.2 |
| Ethanol | 26.4 |
| Isopropanol | 23.5 |
| 2-Butanol | 22.1 |
| 1-Octanol | 19.0 |
| 1-Methoxy-2-propanol | ~21 |
| Ethyl lactate | 20.2 |
| Ethylene glycol dimethyl ether | 18.1 |
| Di(ethylene glycol) diethyl-ether | 17.7 |
| Di(propylene glycol) methyl ether | ~21.5 |
| Tetrahydrofuran | 19.0 |
| 1,4-Dioxane | 20.5 |
| Acetone | 19.7 |
| 2-Butanone | 19.0 |
| Cyclopentanone | 21.3 |
| Cyclohexanone | 20.2 |
| Ethyl acetate | 18.4 |
| Propyl acetate | 18.0 |
| n-Butyl acetate | 17.7 |
| δ-Valerolactone | 19.6 |
| Dimethyl carbonate | 19.5 |
| Diethyl carbonate | 18.4 |
| Propylene carbonate | 27.2 |
| N,N-Dimethylformamide | 24.0 |
| N,N-Dimethylacetamide | 22.6 |
| N-Methylpyrrolidone | 22.8 |
| Acetonitrile | 24.2 |
| Propionitrile | 21.8 |
| Butylronitrile | 20.5 |

Additionally, those skilled in the art will recognize that the bond-promoting hydrocarbon compounds identified in TABLE 1 include aromatic compounds, and compounds containing double bonds. Such materials may be useful for bonding thermoplastic materials or the type described herein. However, because their presence is also known by those skilled in the art to potentially affect the optical clarity and intrinsic fluorescent properties of COC plastics, their utility for providing the bonded articles would need to be evaluated on a case-by-case basis.

The first of the solutions found to effectively promote case-II mediated bonding of COCs such as ZEONOR® comprises a binary mixture of 80 wt % ethanol and a 20 wt % DECALIN® (DECALIN® is a cis-trans mixture of decahydronaphthalene, and is hereinafter referred to as simply "decahydronaphthalene,") available from E. I. Du Pont de Nemours and Company, Wilmington, Del. This mixture applied as a liquid was found to produce bonds with superior strength and minimal distortion of microfluidic devices. We also found it to be more reliably useful than a vapor phase infusion, and more robust than pure-solvent or ternary mixtures. Each of these methods is described below.

Figure 7:
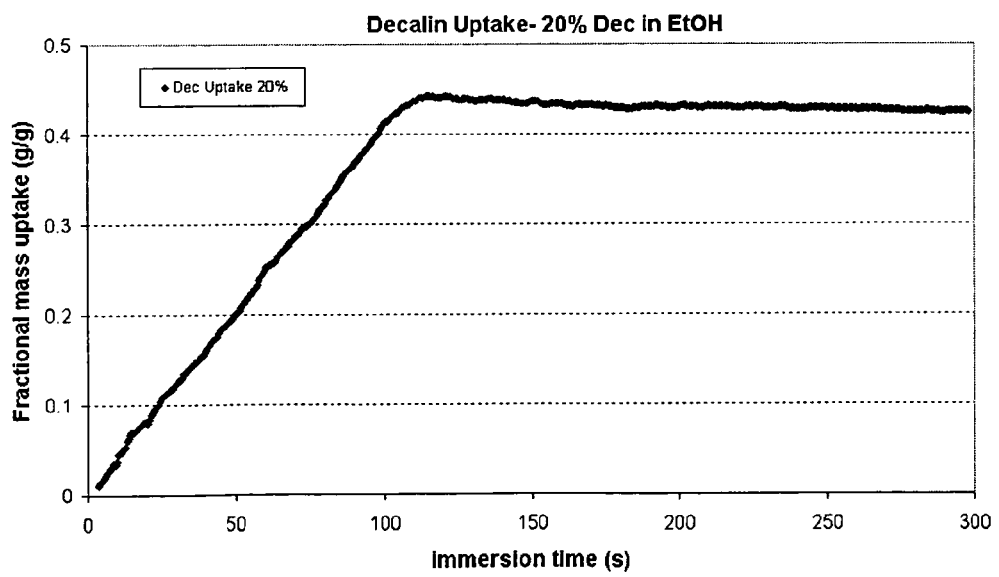
FIG. 7 shows the rate of swelling of ZEONOR® 1060 in an 80:20 solution of ethanol and decahydronaphthalene (cis-trans mixture), the preferred bond-promoting composition.

The bonding process is conducted using infusion conditions listed below and details of the various permeant solutions are shown in TABLE 3 below. When an 80:20 (wt %) mixture of ethanol/decahydronaphthalene is used as the infusing medium at 20° C., case-II uptake occurs with $v_0$=0.2 µm/min and equilibrium mass uptake of approx. 0.42 g permeant/g polymer as illustrated in FIG. 7. It should be noted, however, that the binary ethanol/decahydronaphthalene system is sensitive to mixture composition; slight concentration changes produce marked quantitative changes in case-II permeation behavior of ZEONOR® as indicated below in TABLE 4. Moreover, not infrequently, when some of the plastic components are not fully exposed to the permeant we have found that a surface layer or "skin" develops on the surface of the plastic sheet and appears to interfere with the bonding process. Our work shows that in order to facilitate robust and reliable bonding it is necessary for all the plastic components to be bonded to receive at least a brief exposure to the permeant in order to break through this surface layer.

Figure 8:
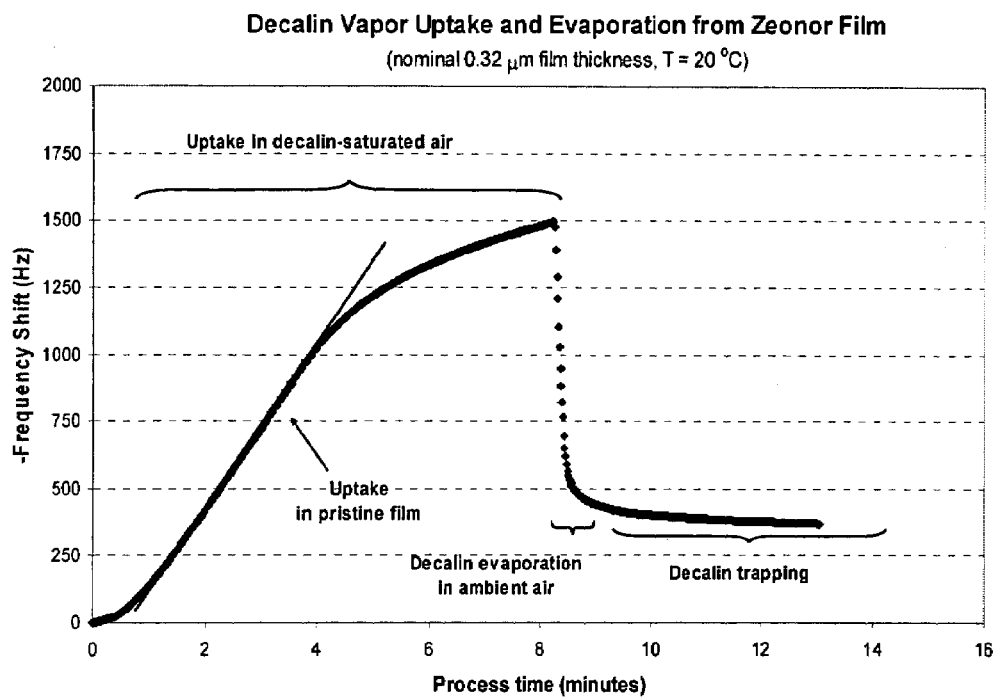
FIG. 8 shows the rate of vapor uptake and desorption of decahydronaphthalene (cis-trans mixture).

Once a permeant has migrated into the polymer surface, its utility as a bond-promoter depends on its continued residence in the activated bonding layer. Loss from this layer can occur either by evaporation or by diffusion into the polymeric bulk. For decahydronaphthalene, evaporation appears to be the predominant loss mechanism. FIG. 8 illustrates that evaporative loss from the permeated zone is complex, but that approximately 80% of the decahydronaphthalene initially present in the permeated zone is rapidly lost due to evaporation. The remaining roughly 20% is held in the permeated zone for an extended period (several hours). This trapped decahydronaphthalene remnant appears to be responsible for aiding the bonding process. Following bonding and a low-temperature annealing bake, the hardness of the bonding layer is indistinguishable from the ZEONOR® bulk by micro-indentation, suggesting that remaining decahydronaphthalene diffuses away in the course of bonding and annealing. This behavior is highly reproducible and may result from vitrification of the ZEONOR® matrix or formation of a surface layer or "skin" on the film. Long-term retention of decahydronaphthalene is the phenomenon most likely to account for the improved bonding behavior observed using binary decahydronaphthalene mixtures.

Figure 9:
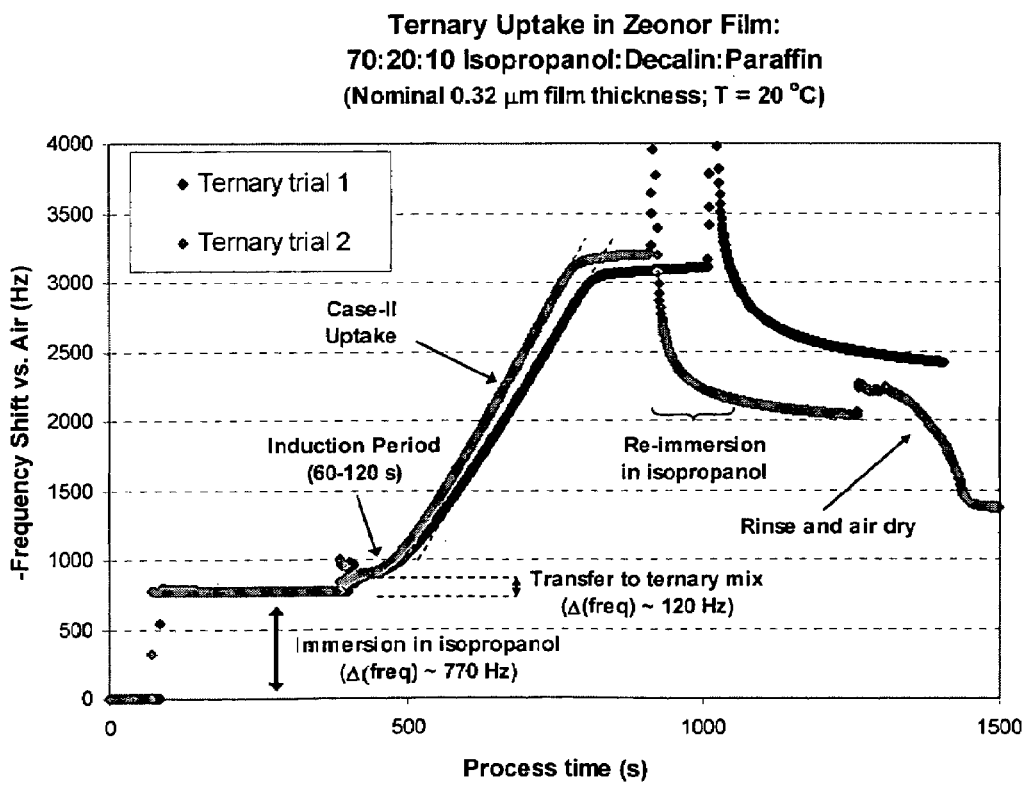
FIG. 9 shows the rate of Zeonor ZEONOR® uptake of a 70:20:10 ternary solution mixture of isopropanol, decahydronaphthalene (cis-trans mixture), and paraffin.

Ternary mixtures may also be employed as bonding aids. As an example, we have examined mixtures of isopropanol, decahydronaphthalene, and paraffin. Results are shown in FIG. 9 which shows the rate of ZEONOR® uptake of a 70:20:10 ternary solution mixture of isopropanol:decahydronaphthalene:paraffin. The mass of retained permeant can be estimated by comparing pre-immersion frequency (point A of the Figure) with post-drying frequency (point D of the figure) or by comparing post-isopropanol immersion frequency (point B) with re-immersion isopropanol frequency (point C). The advantages of this implementation are that a) the ability to co-permeate high-molecular weight species into the bonding layer (paraffin itself does not permeate into ZEONOR® at any measurable rate under similar conditions); and b) the ability to retain non-volatile bonding aids in the bonding layer. In contrast to pure decahydronaphthalene, the portion of the permeant mixture that is retained following evaporation is much higher (on the order of 60% to 70% for a ternary 70:20:10 isopropanol/decahydronaphthalene/paraffin mixture.) Overall, case-II dominated behavior is observed in these examples, and permeant front-velocities are comparable to those of the binary ethanol/decahydronaphthalene mixtures. In principle, the use of ternary mixtures may allow improved process control for enhanced bonding.

1) the bonding surfaces 112 and 122 of cover piece 110 of feature-containing body piece 120 respectively are first rinsed off with acetone and isopropanol, followed by blow drying those surfaces with a stream of dry nitrogen gas;
2) cover piece 110 is then soaked in permeant/diluent solution mixture 130 for about 15 minutes at room ambient temperature (~21° C.) thereby forming permeant-rich layer 114, followed by dipping cover piece 110 in a Petri dish of an alcohol such as ethanol, rinsing with fresh alcohol from a wash bottle, and then blow drying with nitrogen;
3) body piece 120 is then soaked in the permeant/diluent solution mixture 130 for about ½ minutes at room ambi-

TABLE 3

| Thermoplastic media | Constituents | | | Compositional Wt. Ratio | Cover/Body Immersion Times (min.) | Interface Failure Mode |
|---|---|---|---|---|---|---|
| | 1st Hydrocarbon | 2nd Hydrocarbon | 3rd Hydrocarbon | | | |
| ZOENOR® 1060 | | | | | | |
| 1. | Decahydronaphthalene | Ethanol | | 20:80 | 15/0.5 | Cohesive |
| 2. | Decahydronaphthalene | Acetone | | 20:80 | 6/0.5 | Cohesive |
| 3. | Cyclohexane | Methanol | | 25:75 | 3/0.5 | Cohesive |
| 4. | Limonene | Ethyl lactate | | 25:75: | 4/0.7 | Cohesive |
| 5. | Dodecane | Tetrahydrofuran | | 20:80 | 0.5/0.2 | Cohesive |
| 6. | Hexadecane | 1-Octanol | | 25:75 | 28/1 | Cohesive |
| 7. | Decahydronaphthalene | Acetonitrile + Tetrahydrofuran | | 10:60:30 | 3/0.5 | Cohesive |
| 8. | Decahydronaphthalene | Ethanol | n-Hexadecane | 20:70:10 | 2/0.3 | Cohesive |
| 9. | Decahydronaphthalene | Isopropanol | Tetramethylpentadecane | 20:70:10 | 20/20 | Cohesive |
| 10. | Decahydronaphthalene | Isopropanol | Eicosane | 20:70:10 | 20/20 | Cohesive |
| 11. | Decahydronaphthalene | Isopropanol | Paraffin | 20:70:10 | 3/0.5 | Cohesive |
| 12. | n-Hexadecane | Di(propylene glycol) methyl ether | Tetramethylpentadecane | 20:70:10 | 10/0.5 | Cohesive |
| 13. | Cyclohexane | n-Butyl acetate | Tetramethylpentadecane | 10:85:5 | 3.5/0.5 | Cohesive |
| 14. | Decahydronaphthalene | N-Methylpyrrolidone + Tetrahydrofuran | Tetradecane | 5:85:10 + 5 | | Cohesive |
| TOPAS® 8007 | | | | | | |
| 15. | Decahydronaphthalene | Acetone | | 15:85 | 2/0.5 | Cohesive |
| 16. | Isopropyl benzene | Diethyl carbonate | | 25:75 | 3/0.5 | Cohesive |

TABLE 4

| Composition (wt %) | Case-II front velocity (μm/min) | Equilibrium uptake (g permeant/ g ZEONOR® 1060) |
|---|---|---|
| 75:25 Ethanol:decahydronapthhalene | 0.81 | 0.63 |
| 80:20 Ethanol:decahydronapthhalene (Determined using QCM) | 0.18 | 0.43 |
| 80:20 Ethanol:decahydronapthhalene (Determined using iodine staining) | 0.12 | not determined |
| 85:15 Ethanol:decahydronapthhalene | 0.005 | 0.28 |
| 100 decahydronapthhalene vapor | 0.085 | 0.6 |

BEST MODE

We have identified the following procedure, as illustrated with reference to FIGS. 1A-1D, as enabling permeant mediated bonding of thermoplastics:

ent temperature to form permeant-rich layer 124, dipping the body piece 120 in a Petri dish of an alcohol such as ethanol, rinsing with fresh alcohol from a wash bottle, and then blow drying with nitrogen;
4) the bond surfaces 112 and 122 of cover and body pieces 110 and 120 are now mated to form stack 140 and applying Kapton® tape (Kapton® is a registered trademark of the E. I. Du Pont de Nemours and Company Corporation) 150 to stack 140 perimeter, so as to cover bond line 142;
5) stack 140 is placed into a hydraulic press (indicated as arrows 160) and aligned between press platens 162 and 164;
4) the bond surfaces 112 and 122 of cover and body pieces 110 and 120 are now mated to form stack 140 and applying KAPTON® tape (KAPTON® is a registered trademark of the E. I. Du Pont de Nemours and Company Corporation) 150 to stack 140 perimeter, so as to cover bond line 142;
7) once heated a load of about 180 psi is applied to platens 162 and 164 and maintained (i.e., adjusting press load if it has drifted under load) for about 20 minutes;
8) press platens 162 and 164 are then cooled by running water over them for about 10 minutes or until the indicated press temperature has decreased to less than about 27° C. at which point bonded article 100 is removed from press 160.

Figure 10A:
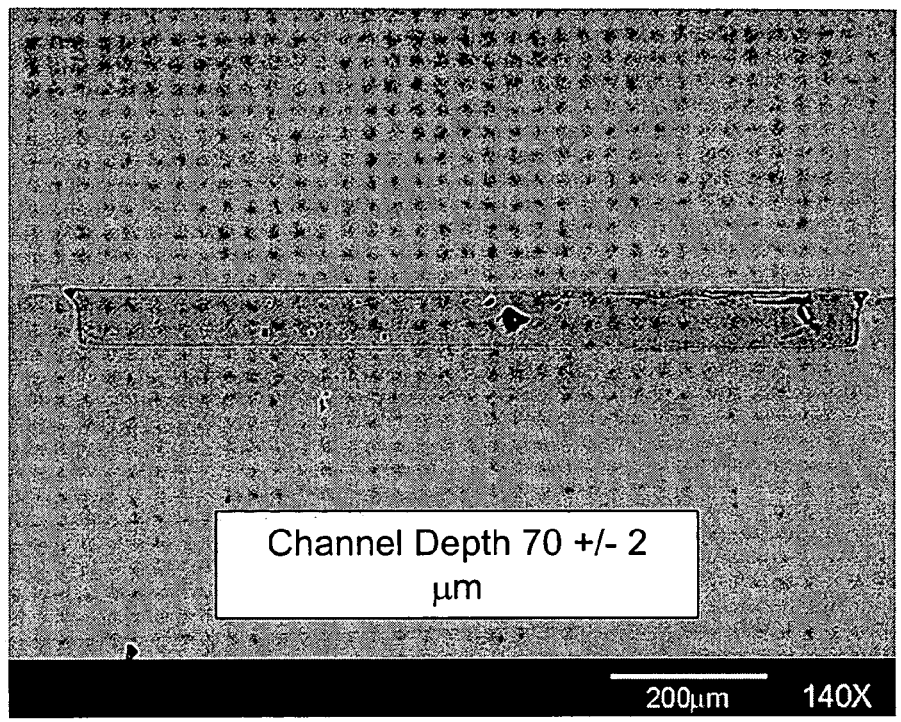
FIG. 10A shows a nominal 1000 µm×70 µm example of a sealed, distortion-free microchannel viewed in cross-section produced by using an 80:20 ethanol and decahydronaphthalene (cis-trans mixture) case-II infusion to promote bonding.
Figure 10B:
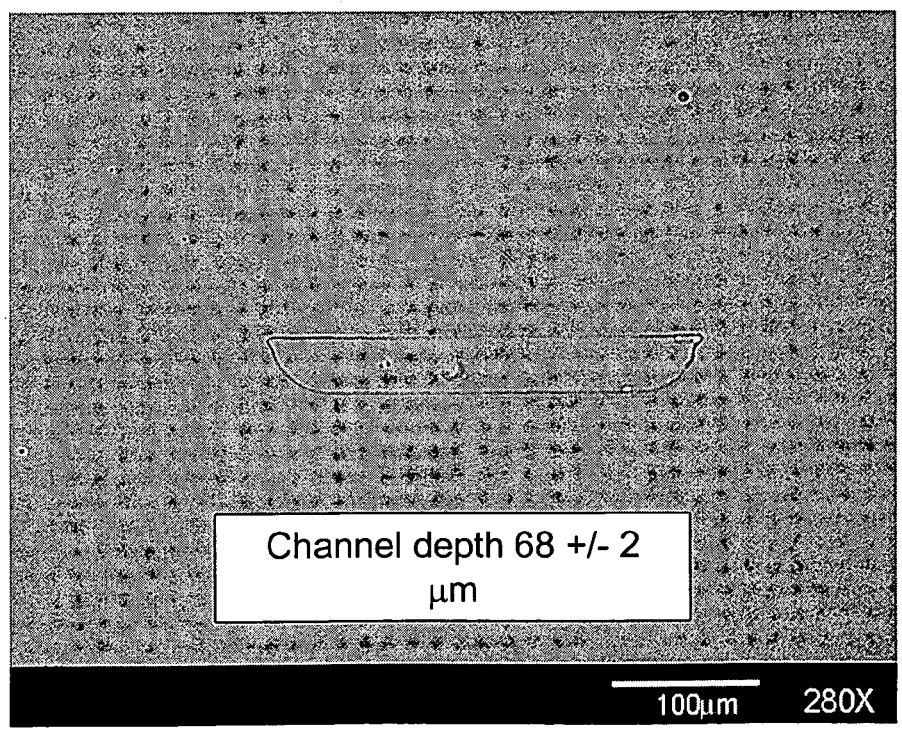
FIG. 10B shows a nominal 300 µm×70 µm example of a sealed, distortion-free microchannel viewed in cross-section produced by using an 80:20 ethanol and decahydronaphthalene (cis-trans mixture) case-II infusion to promote bonding.

One embodiment of the permeant-mediated ZEONOR® bonding process described above employs a binary mixture of ethanol and decahydronaphthalene in a weight ratio of 80 wt % to 20 wt % as a bonding aid. This bonding process is routinely successful at producing multilayer microfluidic devices with no optically detectable channel collapse. FIGS. 10A and 10B show representative cross-sections of embedded microfluidic channels in parts joined using this process and using the 80:20 mixture of ethanol and decahydronaphthalene. FIG. 10A shows a sealed, distortion-free (nominally) 1000 μm×70 μm microchannel and FIG. 10B shows a (nominally) 300 μm×70 μm microchannel.

Figure 12:
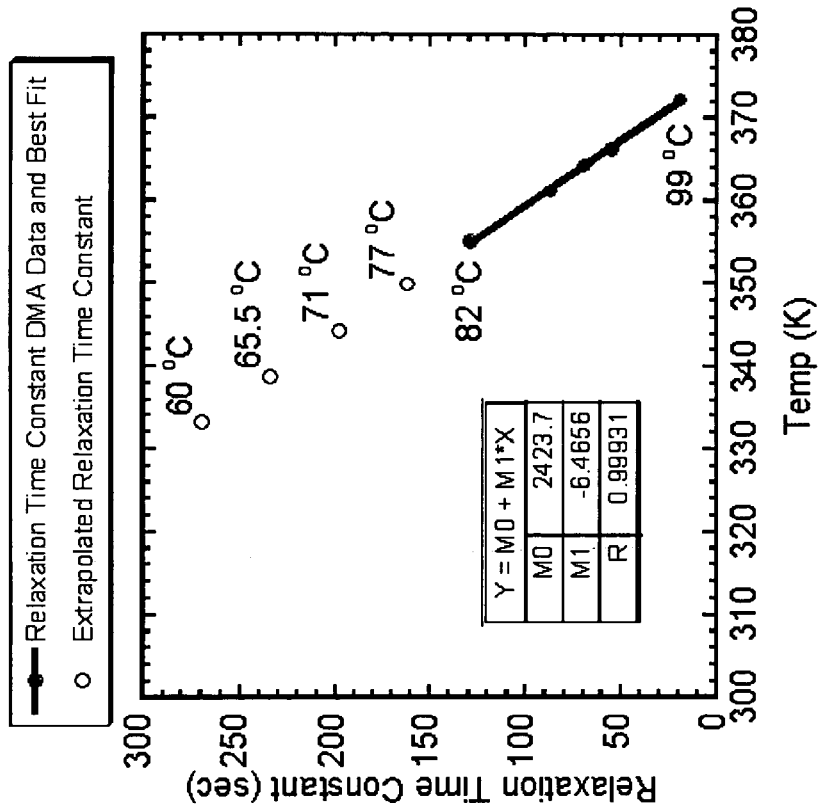
FIG. 12 shows experimental and extrapolated characteristic times for ZEONOR® relaxation (determined from mathematical fits to the data presented in FIG. 11).
Figure 11:
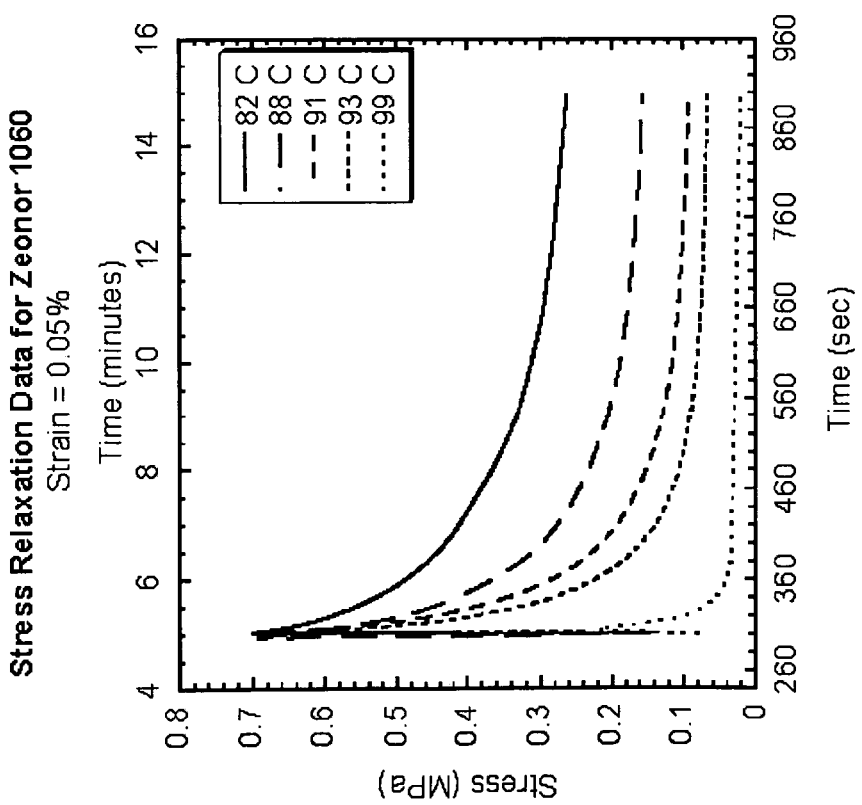
FIG. 11 shows the stress relaxation behavior for ZEONOR® 1060 at temperatures approaching its glass transition ("$T_g$") temperature.

The reduced degree of channel distortion can be explained by the results of a dynamic mechanical analysis (DMA) study (see FIGS. 11-12). At 60° C., the extrapolated characteristic time for stress relaxation (at 0.05% strain) in ZEONOR® is approximately 270 seconds although it should be noted that this extrapolation relies on data generated at a temperature much closer to the glass transition temperature of ZEONOR® 1060 ($T_g$=100° C.) and, therefore, probably significantly underestimates the characteristic time. In any case, the ratio of the bonding time (20 minutes) to the characteristic time (~4.5 minutes) is still substantial (~5:1) but is small relative to the ratio of bonding time to the characteristic time for the thermal bonding process which is known to be about 30:1. The DMA study also indicates that ZEONOR® undergoes predominantly elastic deformation at this temperature. Furthermore, the loss modulus associated with viscous deformation is in a broad thermal minimum at ~3000 psi.

Characterization of the case-II diffusion of the ethanol/decahydronaphthalene mixture into ZEONOR® suggests that an activated bonding zone approximately 2 μm deep is formed in the ZEONOR® cover piece in this embodiment. The activated zone retains approximately 10 wt % decahydronaphthalene for significant periods of time following the infusion process; the residual decahydronaphthalene acts to effectively plasticize the polymer at the bond line.

Bond-strength measurements for devices joined using this process were made by hydraulically loading the channel structure placed into the bonded parts to failure. Yield strengths of approximately 2000 psi were measured and microscopic visualization of the channel failure was found to be consistent with cohesive, rather than adhesive, failure.

It is to be understood that while the invention has been described in conjunction with the preferred specific embodiments thereof, that the foregoing description as well as the examples which follow are intended to illustrate and not limit the scope of the invention. Other aspects, advantages and modifications within the scope of the invention will be apparent to those skilled in the art to which the invention pertains.

EXAMPLES

The following examples are put forth so as to provide those of ordinary skill in the art with a complete disclosure and description of how to prepare and use the compositions and devices disclosed and claimed herein. Efforts have been made to ensure accuracy with respect to numbers (e.g., amounts, temperature, etc.) but some errors and deviations should be accounted for. Those of ordinary skill in the art will recognize that process parameters used in plastics processing methods that occur prior to device assembly and bonding (such as injection molding and hot-embossing) may vary widely and may furthermore significantly modify the physical and chemical properties of the resulting plastic parts. Modifications and deviations arising from such prior process steps should also be accounted for. Unless indicated otherwise, parts are parts by weight, temperature is in degrees Celsius, and pressure is in pounds per square inch (psi). Additionally, all materials were obtained commercially.

Example 1

Two injection-molded ZEONOR® 1060 coupons are rinsed with acetone and isopropanol, and then dried under a nitrogen stream. The first coupon is immersed for 15 min in a solution consisting essentially of 80 wt % ethanol and 20 wt % decahydronaphthalene at 21° C. The second coupon is immersed in the same solution for 30 s at 21° C. Following immersion, the coupons are rinsed with isopropanol for approximately 30 s, then dried under a gentle nitrogen stream. The two coupons are mated and KAPTON® tape is applied to the perimeter, covering the bond line. The mated coupons are placed between pressure plates and the assembly is inserted between the platens of a CARVER® press. The platens are adjusted until the top platen just touches the top of the assembly; at this point, the press is heated to 60° C. over the course of 15 min. Following heating, the assembly is loaded at 200 psi for 25 min. The press is cooled with running water (~10 min.) to less than 27° C.; the bonded coupon is removed. Coupons are then baked in an oven at 57° C. for 24 h. A knife-edge spatula and hammer were used to attempt to separate the bonded coupon assembly at the bond line. All attempts to separate the coupons resulted in fracture of the coupons rather than separation at the bond line. Fine features are visibly preserved along the bond line.

This example demonstrates COC bonding using a binary mixture with a low molecular weight $2^{nd}$ hydrocarbon alcohol compound (C2).

Example 2

Two injection-molded ZEONOR® 1060 coupons are rinsed with acetone and isopropanol, then dried under a nitrogen stream. The first coupon is immersed for 6 min in a solution consisting essentially of 80 wt % acetone and 20 wt % decahydronaphthalene at 21° C. The second coupon is immersed in the same solution for 30 s at 21° C. Following immersion, the coupons are rinsed with isopropanol for approximately 30 s, and then dried under a gentle nitrogen stream. The two coupons are mated and KAPTON® tape is applied to the perimeter, covering the bond line. The mated coupons are placed between pressure plates and the assembly is inserted between the platens of a CARVER® press. The platens are adjusted until the top platen just touches the top of the assembly; at this point, the press is heated to about 60° C. over the course of 15 min. Following heating, the assembly is loaded at 200 psi for 25 min. The press is cooled with running water (~10 min.) to less than 27° C.; the bonded coupon is removed. Coupons are then baked in an oven at 57° C. for 24 h. A knife-edge spatula and hammer were used to attempt to separate the bonded coupon assembly at the bond line. All attempts to separate the coupons resulted in fracture of the coupons rather than separation at the bond line. Fine features are visibly preserved along the bond line.

This example demonstrates COC bonding using a binary mixture with a $2^{nd}$ hydrocarbon ketone compound rather than an alcohol.

Example 3

Two injection-molded ZEONOR® 1060 coupons are rinsed with acetone and isopropanol, and then dried under a nitrogen stream. The first coupon is immersed for 3 min in a room ambient solution consisting essentially of 75 wt % methanol and 25 wt % cyclohexane. The second coupon is immersed in the same solution for 30 s at 21° C. Following immersion, the coupons are dried under a gentle nitrogen stream, then immediately mated. The two coupons are mated and KAPTON® tape is applied to the perimeter, covering the bond line. The mated coupons are placed between pressure plates and the assembly is inserted between the platens of a CARVER® press. The platens are adjusted until the top platen just touches the top of the assembly; at this point, the press is heated to 60° C. over the course of 15 min. Following heating, the assembly is loaded at 200 psi for 25 min. The press is cooled with running water (~10 min.) to less than 27° C.; the bonded coupon is removed. Coupons are then baked in an oven at 57° C. for >24 h. A knife-edge spatula and hammer were used to attempt to separate the bonded coupon assembly at the bond line. All attempts to separate the coupons resulted in fracture of the coupons rather than separation at the bond line. Fine features are visibly preserved along the bond line.

This example demonstrates COC bonding using binary mixture with a low molecular weight $2^{nd}$ hydrocarbon alcohol compound (C1) and low molecular weight $1^{st}$ hydrocarbon compound (C6).

Example 4

Two injection-molded ZEONOR® 1060 coupons are rinsed with acetone and isopropanol, then dried under a nitrogen stream. The first coupon is immersed for 4 min in a room ambient solution consisting essentially of 75 wt % ethyl lactate and 25 wt % limonene. The second coupon is immersed in the same solution for 40 s at 21° C. Following immersion, the coupons are rinsed with isopropanol for approximately 30 s, and then dried under a gentle nitrogen stream. The two coupons are mated and KAPTON® tape is applied to the perimeter, covering the bond line. The mated coupons are placed between pressure plates and the assembly is inserted between the platens of a CARVER® press. The platens are adjusted until the top platen just touches the top of the assembly; at this point, the press is heated to 60° C. over the course of 15 min. Following heating, the assembly is loaded at 200 psi for 25 min. The press is cooled with running water (~10 min.) to less than 27° C.; the bonded coupon is removed. Coupons are then baked in an oven at 57° C. for >16 h. A knife-edge spatula and hammer were used to attempt to separate the bonded coupon assembly at the bond line. All attempts to separate the coupons resulted in fracture of the coupons rather than separation at the bond line. Fine features are visibly preserved along the bond line.

This example demonstrates COC bonding using a binary mixture using an ester functional-group containing a $2^{nd}$ hydrocarbon alcohol compound. It uses limonene, a double-bond containing C10 cyclic and branched $1^{st}$ hydrocarbon compound.

Example 5

Two injection-molded ZEONOR® 1060 coupons are rinsed with acetone and isopropanol, then dried under a nitrogen stream. The first coupon is immersed for 30 s in a solution consisting essentially of 80 wt % tetrahydrofuran and 20 wt % dodecane at 21° C. The second coupon is immersed in the same solution for 10 s at 21° C. Following immersion, the coupons are rinsed with isopropanol for approximately 30 s, and then dried under a gentle nitrogen stream. The two coupons are mated and KaPTON® tape is applied to the perimeter, covering the bond line. The mated coupons are placed between pressure plates and the assembly is inserted between the platens of a CARVER® press. The platens are adjusted until the top platen just touches the top of the assembly; at this point, the press is heated to 60° C. over the course of 15 min. Following heating, the assembly is loaded at 200 psi for 25 min. The press is cooled with running water (~10 min.) to less than 27° C.; the bonded coupon is removed. Coupons are then baked in an oven at 57° C. for >24 h. A knife-edge spatula and hammer were used to attempt to separate the bonded coupon assembly at the bond line. All attempts to separate the coupons resulted in fracture of the coupons rather than separation at the bond line. Fine features are visibly preserved along the bond line.

This example demonstrates COC bonding using a binary mixture with a $2^{nd}$ hydrocarbon ether rather than an alcohol.

Example 6

Two injection-molded ZEONOR® 1060 coupons are rinsed with acetone and isopropanol, then dried under a nitrogen stream. The first coupon is immersed for 28 min. in a solution consisting essentially of 75 wt % 1-octanol and 25 wt % hexadecane at 40° C. The second coupon is immersed in the same solution for 1 min. at 40° C. Following immersion, the coupons are rinsed with isopropanol for approximately 30 s, and then dried under a gentle nitrogen stream. The two coupons are mated and KAPTON® tape is applied to the perimeter, covering the bond line. The mated coupons are placed between pressure plates and the assembly is inserted between the platens of a CARVER® press. The platens are adjusted until the top platen just touches the top of the assembly; at this point, the press is heated to 60° C. over the course of 15 min. Following heating, the assembly is loaded at 200 psi for 25 min. The press is cooled with running water (~10 min.) to less than 27° C.; the bonded coupon is removed. Coupons are then baked in an oven at 57° C. for >24 h. A knife-edge spatula and hammer were used to attempt to separate the bonded coupon assembly at the bond line. All attempts to separate the coupons resulted in fracture of the coupons rather than separation at the bond line. Fine features are visibly preserved along the bond line.

This example demonstrates COC bonding using a binary mixture with a high molecular weight $2^{nd}$ hydrocarbon alcohol compound (C8) and a high molecular weight hydrocarbon compound (C16).

Example 7

Two injection-molded ZEONOR® 1060 coupons are rinsed with acetone and isopropanol, then dried under a nitrogen stream. The first coupon is immersed for 3 min 40 s in a room ambient (~21° C.) solution consisting essentially of 60 wt % acetonitrile+30 wt % tetrahydrofuran, and 10 wt % decahydronaphthalene. The second coupon is immersed in the same solution for 30 s. Following immersion, the coupons are rinsed with isopropanol for approximately 30 s, and then dried under a gentle nitrogen stream. The two coupons were mated and KAPTON® tape was applied to the perimeter, covering the bond line. The mated coupons were placed between pressure plates and the assembly was inserted between the platens of a CARVER® press. The platens were adjusted until the top platen just touches the top of the assembly at which point the press was heated to about 60° C. over the course of about 15 minutes. Once fully heated, the platens were pressed against the coupon assembly and a load of about 200 psi was applied to the coupon assembly for 40 minutes after which the press was cooled was cooled to a temperature of about 27° C. and the bonded coupon was removed. The coupon assembly was then baked in an oven at about 57° C. for 24 hours. A knife-edge spatula and hammer were used to attempt to separate the bonded coupon assembly at the bond line. All attempts to separate the coupons resulted in fracture of the coupons rather than separation at the bond line.

This example demonstrates COC bonding using a binary-type mixture with a nitrile as the principal $2^{nd}$ hydrocarbon component. THF is required as an additional $2^{nd}$ hydrocarbon compound to render the mixture miscible.

Example 8

Two injection-molded ZEONOR® 1060 coupons are rinsed with acetone and isopropanol, then dried under a nitrogen stream. The first coupon is immersed for 2 min in a solution consisting essentially of 70 wt % ethanol, 20 wt % decahydronaphthalene, and 10 wt % hexadecane at 21° C. The second coupon is immersed in the same solution for 20 s at 21° C. Following immersion, the coupons are rinsed with isopropanol for approximately 30 s, and then dried under a gentle nitrogen stream. The two coupons are mated and KAPTON® tape is applied to the perimeter, covering the bond line. The mated coupons are placed between pressure plates and the assembly is inserted between the platens of a CARVER® press. The platens are adjusted until the top platen just touches the top of the assembly; at this point, the press is heated to 60° C. over the course of 15 min. Following heating, the assembly is loaded at 200 psi for 25 min. The press is cooled with running water (~10 min.) to less than 27° C.; the bonded coupon is removed. Coupons are then baked in an oven at 57° C. for >16 h. A knife-edge spatula and hammer were used to attempt to separate the bonded coupon assembly at the bond line. All attempts to separate the coupons resulted in fracture of the coupons rather than separation at the bond line. Fine features are visibly preserved along the bond line.

This example demonstrates COC bonding using a ternary mixture with a lower molecular weight 2nd hydrocarbon alcohol compound (C2) and a lower molecular weight $3^{rd}$ hydrocarbon compound (C16).

Example 9

Two injection-molded ZEONOR® 1060 coupons were rinsed with acetone and isopropanol, and then dried under a nitrogen stream. The coupons were immersed in a solution consisting essentially of 70 wt % isopropanol, 20 wt % decahydronaphthalene, and 10 wt % tetramethylpentadecane for 20 minutes at about 20° C. Following immersion, the coupons were rinsed with isopropanol for approximately 30 seconds, then dried under a gentle nitrogen stream. The two coupons were mated and KAPTON® tape was applied to the perimeter, covering the bond line. The mated coupons were placed between pressure plates and the assembly was inserted between the platens of a CARVER® press. The platens were adjusted until the top platen just touches the top of the assembly at which point the press was heated to about 60° C. over the course of about 15 minutes. Once fully heated, the platens were pressed against the coupon assembly and a load of about 200 psi was applied to the coupon assembly for 40 minutes after which the press was cooled was cooled to a temperature of about 27° C. and the bonded coupon was removed. The coupon assembly was then baked in an oven at about 57° C. for 24 hours. A knife-edge spatula and hammer were used to attempt to separate the bonded coupon assembly at the bond line. All attempts to separate the coupons resulted in fracture of the coupons rather than separation at the bond line.

This example demonstrates COC bonding using a ternary mixture with a branched $3^{rd}$ hydrocarbon compound.

Example 10

Two injection-molded ZEONOR® 1060 coupons were rinsed with acetone and isopropanol, then dried under a nitrogen stream. A solution consisting essentially of isopropanol, decahydronaphthalene, and eicosane was prepared by first dissolving 10 grams of eicosane into 20 grams decahydronaphthalene and then adding this mixture to 70 grams isopropanol while stirring the solution being prepared. The small amount of eicosane crystals that form during stirring are removed by filtration. The coupons are immersed in the filtered solution for 20 minutes at 21° C. Following immersion, the coupons are rinsed with isopropanol for approximately 30 S, then dried under a gentle nitrogen stream. The two coupons were mated and KAPTON® tape was applied to the perimeter, covering the bond line. The mated coupons were placed between pressure plates and the assembly was inserted between the platens of a CARVER® press. The platens were adjusted until the top platen just touches the top of the assembly at which point the press was heated to about 60° C. over the course of about 15 minutes. Once fully heated, the platens were pressed against the coupon assembly and a load of about 200 psi was applied to the coupon assembly for 40 minutes after which the press was cooled was cooled to a temperature of about 27° C. and the bonded coupon was removed. The coupon assembly was then baked in an oven at about 57° C. for 24 hours. A knife-edge spatula and hammer were used to attempt to separate the bonded coupon assembly at the bond line. All attempts to separate the coupons resulted in fracture of the coupons rather than separation at the bond line.

This example demonstrates COC bonding using a ternary mixture.

Example 11

Two injection-molded ZEONOR® 1060 coupons are rinsed with acetone and isopropanol, then dried under a nitrogen stream. The first coupon is immersed for 3 min. in a solution consisting essentially of 70 wt % isopropanol, 20 wt % decahydronaphthalene, and 10% paraffin oil at 21° C. The second coupon is immersed in the same solution for 30 s at 21° C. The paraffin oil was analyzed by gas-chromatography/mass-spectrometry (GC-MS) and found to contain a mixture of long-chain aliphatic hydrocarbons. Individual components containing between 15 and 30 carbons were determined to be present. Following immersion, the coupons are rinsed with isopropanol for approximately 30 s, and then dried under a gentle nitrogen stream. The two coupons were mated and KAPTON® tape was applied to the perimeter, covering the bond line. The mated coupons were placed between pressure plates and the assembly was inserted between the platens of a CARVER® press. The platens were adjusted until the top platen just touches the top of the assembly at which point the press was heated to about 60° C. over the course of about 15 minutes. Once fully heated, the platens were pressed against the coupon assembly and a load of about 200 psi was applied to the coupon assembly for 40 minutes after which the press was cooled was cooled to a temperature of about 27° C. and the bonded coupon was removed. The coupon assembly was then baked in an oven at about 57° C. for 24 hours. A knife-edge spatula and hammer were used to attempt to separate the bonded coupon assembly at the bond line. All attempts to separate the coupons resulted in fracture of the coupons rather than separation at the bond line.

This example demonstrates COC bonding using a ternary mixture with a high molecular weight $3^{rd}$ hydrocarbon compound (of up to C30).

Example 12

Two injection-molded ZEONOR® 1060 coupons are rinsed with acetone and isopropanol, and dried under a nitrogen stream. The first coupon is immersed for 10 min in a room ambient (~21° C.) solution consisting essentially of 70 wt % di(propylene glycol) methyl ether, 20 wt % hexadecane, and 10 wt % 2, 6, 10, 14 tetramethylpentadecane. The second coupon is immersed in the same solution for 30 s. Following immersion, the coupons are rinsed with isopropanol for approximately 30 s, and then dried under a gentle nitrogen stream. The two coupons were mated and KAPTON® tape was applied to the perimeter, covering the bond line. The mated coupons were placed between pressure plates and the assembly was inserted between the platens of a CARVER® press. The platens were adjusted until the top platen just touches the top of the assembly at which point the press was heated to about 60° C. over the course of about 15 minutes. Once fully heated, the platens were pressed against the coupon assembly and a load of about 200 psi was applied to the coupon assembly for 40 minutes after which the press was cooled was cooled to a temperature of about 27° C. and the bonded coupon was removed. The coupon assembly was then baked in an oven at about 57° C. for 24 hours. A knife-edge spatula and hammer were used to attempt to separate the bonded coupon assembly at the bond line. All attempts to separate the coupons resulted in fracture of the coupons rather than separation at the bond line.

This example demonstrates COC bonding using ternary mixture that uses an ether functional-group containing $2^{nd}$ hydrocarbon-alcohol compound. It uses a high molecular weight 1st hydrocarbon (C16) and branched $3^{rd}$ hydrocarbon.

Example 13

Two injection-molded ZEONOR® 1060 coupons are rinsed with acetone and isopropanol, then dried under a nitrogen stream. The first coupon is immersed for 3.5 min. in a room ambient (~21° C.) solution consisting essentially of 85 wt % n-butyl acetate, 10 wt % cyclohexane, and 5 wt % 2,6,10,14-tetramethylpentadecane. The second coupon is immersed in the same solution for 30 s. Following immersion, the coupons are rinsed with isopropanol for approximately 30 s, and then dried under a gentle nitrogen stream. The two coupons were mated and KAPTON® tape was applied to the perimeter, covering the bond line. The mated coupons were placed between pressure plates and the assembly was inserted between the platens of a CARVER® press. The platens were adjusted until the top platen just touches the top of the assembly at which point the press was heated to about 60° C. over the course of about 15 minutes. Once fully heated, the platens were pressed against the coupon assembly and a load of about 200 psi was applied to the coupon assembly for 40 minutes after which the press was cooled was cooled to a temperature of about 27° C. and the bonded coupon was removed. The coupon assembly was then baked in an oven at about 57° C. for 24 hours. A knife-edge spatula and hammer were used to attempt to separate the bonded coupon assembly at the bond line. All attempts to separate the coupons resulted in fracture of the coupons rather than separation at the bond line.

This example demonstrates COC bonding using ternary mixture with an $2^{nd}$ hydrocarbon ether compound rather than an alcohol. It uses a low molecular weight $1^{st}$ hydrocarbon compound (C6) and a branched $3^{rd}$ hydrocarbon (C19).

Example 14

Two injection-molded ZEONOR® 1060 coupons are rinsed with acetone and isopropanol, then dried under a nitrogen stream. The first coupon is immersed for 6 min. in a room ambient (~21° C.) solution consisting essentially of 80 wt % N-methyl pyrrolidone, 10 wt % tetrahydrofuran, 5 wt % decahydronaphthalene, and 5 wt % tetradecane. The second coupon is immersed in the same solution for 30 s. Following immersion, the coupons are rinsed with isopropanol for approximately 30 s, and then dried under a gentle nitrogen stream. The two coupons were mated and KAPTON® tape was applied to the perimeter, covering the bond line. The mated coupons were placed between pressure plates and the assembly was inserted between the platens of a CARVER® press. The platens were adjusted until the top platen just touches the top of the assembly at which point the press was heated to about 60° C. over the course of about 15 minutes. Once fully heated, the platens were pressed against the coupon assembly and a load of about 200 psi was applied to the coupon assembly for 40 minutes after which the press was cooled was cooled to a temperature of about 27° C. and the bonded coupon was removed. The coupon assembly was then baked in an oven at about 57° C. for 24 hours. A knife-edge spatula and hammer were used to attempt to separate the bonded coupon assembly at the bond line. All attempts to separate the coupons resulted in fracture of the coupons rather than separation at the bond line.

This example demonstrates COC bonding using a mixture with an amide as the principal $2^{nd}$ hydrocarbon compound. THF is required as an additional $2^{nd}$ hydrocarbon compound to render the mixture miscible. It uses a low molecular weight $3^{rd}$ hydrocarbon compound (C14).

Example 15

Two injection-molded TOPAS® 8007 coupons are rinsed with acetone and isopropanol, then dried under a nitrogen stream. The first coupon is immersed for 2 min in a room ambient (~21° C.) solution consisting essentially of 85 wt % acetone and 15 wt % decahydronaphthalene. The second coupon is immersed in the same solution for 30 s. Following immersion, the coupons are rinsed with isopropanol for approximately 30 s, and then dried under a gentle nitrogen stream. The two coupons were mated and KAPTON® tape was applied to the perimeter, covering the bond line. The mated coupons were placed between pressure plates and the assembly was inserted between the platens of a CARVER® press. The platens were adjusted until the top platen just touches the top of the assembly at which point the press was heated to about 60° C. over the course of about 15 minutes. Once fully heated, the platens were pressed against the coupon assembly and a load of about 200 psi was applied to the coupon assembly for 40 minutes after which the press was cooled was cooled to a temperature of about 27° C. and the bonded coupon was removed. The coupon assembly was then baked in an oven at about 57° C. for 24 hours. A knife-edge spatula and hammer were used to attempt to separate the bonded coupon assembly at the bond line. All attempts to separate the coupons resulted in fracture of the coupons rather than separation at the bond line.

This example demonstrates COC bonding using another COC (TOPAS® 8007; glass transition temperature 80° C.).

Example 16

Two injection-molded TOPAS® 8007 coupons are rinsed with acetone and isopropanol, then dried under a nitrogen stream. The first coupon is immersed for 3 min in a room ambient (~21° C.) solution consisting essentially of 75 wt % diethyl carbonate and 25 wt % isopropyl benzene. The second coupon is immersed in the same solution for 30 s. Following immersion, the coupons are rinsed with isopropanol for approximately 30 s, and then dried under a gentle nitrogen stream. The two coupons were mated and KAPTON® tape was applied to the perimeter, covering the bond line. The mated coupons were placed between pressure plates and the assembly was inserted between the platens of a CARVER® press. The platens were adjusted until the top platen just touches the top of the assembly at which point the press was heated to about 60° C. over the course of about 15 minutes. Once fully heated, the platens were pressed against the coupon assembly and a load of about 200 psi was applied to the coupon assembly for 40 minutes after which the press was cooled was cooled to a temperature of about 27° C. and the bonded coupon was removed. The coupon assembly was then baked in an oven at about 57° C. for 24 hours. A knife-edge spatula and hammer were used to attempt to separate the bonded coupon assembly at the bond line. All attempts to separate the coupons resulted in fracture of the coupons rather than separation at the bond line.

This example demonstrates COC bonding using another COC (TOPAS® 8007, glass transition temperature 80° C.) demonstrating the use of a binary mixture with a $2^{nd}$ hydrocarbon carbonate component rather than an alcohol. It demonstrates the use of an aromatic $1^{st}$ hydrocarbon component.

Finally, to the extent necessary to understand or complete the disclosure of the present invention, all publications, patents, and patent applications mentioned herein are expressly incorporated by reference therein to the same extent as though each were individually so incorporated.

Having thus described exemplary embodiments of the present invention, it should be noted by those skilled in the art that the disclosures herein are exemplary only and that various other alternatives, adaptations, and modifications may be made within the scope of the present invention. Accordingly, the present invention is not limited to the specific embodiments or drawings as illustrated herein, but is only limited by the following claims.

What is claimed is:

1. A method for bonding thermoplastic parts, comprising the steps of:
    (a) immersing mating surfaces of two or more thermoplastic parts in a binary solution comprising a first liquid hydrocarbon compound (diluent) and a second liquid hydrocarbon compound (permeant) miscible in the first liquid hydrocarbon compound, wherein a portion of the permeant penetrates and is retained within a thickness of each of the mating surfaces;
    (b) removing the two or more thermoplastic parts from the binary solution;
    (c) rinsing the mating surfaces with an alcohol and blow drying the mating surfaces with nitrogen;
    (d) stacking and aligning the two or more thermoplastic parts, wherein the mating surfaces form one or more bonding interfaces having one of more peripheral seams;
    (e) applying a tape seal over each of the one or more peripheral bond seams;
    (f) heating and applying an axial pressure load to the stacked thermoplastic parts for a period of time and at a temperature sufficient to promote bonding between the mating surfaces thereby providing a bonded structure; and
    (g) cooling the bonded structure and removing the axial pressure load.

2. The method of claim 1, wherein said thermoplastic parts comprise a cyclic olefin copolymer (COC).

3. The method of claim 1, wherein the first liquid hydrocarbon compound comprises hydrogen and between about 6 and 16 carbon atoms and characterized by a Hildebrand solubility parameter between about 14 $MPa^{1/2}$ and about 18 $MPa^{1/2}$ and the second liquid hydrocarbon compound comprises hydrogen, 1 to 8 carbon atoms, 1 or more hetero-atoms and characterized by a Hildebrand solubility parameter from about 18 $MPa^{1/2}$ to about 29 $MPa^{1/2}$.

4. The method of claim 1, wherein the step of immersing further comprises forming a ternary solution comprising said first and second liquid hydrocarbon compounds and a third liquid hydrocarbon compound miscible to said first and second liquid hydrocarbon compounds and comprising between about 14 and 30 carbon atoms and a Hildebrand solubility parameter between about 13 $MPa^{1/2}$ and about 18 $MPa^{1/2}$.

5. The method of claim 1, wherein the first liquid hydrocarbon compound is selected from the list consisting of n-hexane, iso-octane, n-decane, dodecane, n-hexadecane, cyclohexane, isopropyl benzene, cis-decahydronaphthalene, trans-decahydronaphthalene, and the second liquid hydrocarbon compound is selected from the list consisting of alcohols, ethers, ketones, esters, carbonates, nitrites, and amides having 1 to 8 carbon atoms.

6. The method of claim 5, wherein the first liquid hydrocarbon compound comprises a mixture of cis- and trans-decahydronaphthalene.

7. The method of claim 4, wherein said third liquid hydrocarbon compound is selected from the list of hexadecane, octadecane, eicosane, 2,6,10,14-tetramethylpentadecane, and paraffin oils containing components with up to 30 carbon atoms per molecule.

8. The method of claim 5, wherein the binary solution comprises ethanol and a mixture of cis- and trans-decahydronaphthalene.

9. The method of claim 8, wherein the binary solution comprises 99 wt % to 80 wt % ethanol and 1 wt % to 20 wt % of a cis-trans mixture of decahydronaphthalene.

10. The method of claim 1, further comprising one or more micro-features formed into a thickness of one or more of the mating surfaces to provide a three dimensional structure therein, wherein the fidelity of the 3-dimensional structure is preserved following the steps heating and applying the axial pressure load.

* * * * *